(12) United States Patent
Yun et al.

(10) Patent No.: US 12,122,702 B2
(45) Date of Patent: Oct. 22, 2024

(54) ULTRAPURE WATER SUPPLY APPARATUS, SUBSTRATE PROCESSING SYSTEM INCLUDING THE SAME, AND SUBSTRATE PROCESSING METHOD USING THE SAME

(71) Applicant: SAMSUNG ELECTRONICS CO., LTD., Suwon-si (KR)

(72) Inventors: Jongha Yun, Suwon-si (KR); Seyoon Kim, Hwaseong-si (KR); Juhui Park, Hwaseong-si (KR); Jiyeon Lee, Hwaseong-si (KR); Cheolmin Shin, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 23 days.

(21) Appl. No.: 18/094,820

(22) Filed: Jan. 9, 2023

(65) Prior Publication Data
US 2023/0302502 A1    Sep. 28, 2023

(30) Foreign Application Priority Data
Mar. 22, 2022   (KR) .................... 10-2022-0035146

(51) Int. Cl.
*C02F 9/00*    (2023.01)
*B01D 15/36*   (2006.01)
(Continued)

(52) U.S. Cl.
CPC .............. *C02F 9/00* (2013.01); *B01D 15/361* (2013.01); *B01D 61/02* (2013.01); *B01D 61/025* (2013.01);
(Continued)

(58) Field of Classification Search
CPC .... B01D 15/361; B01D 61/02; B01D 61/025; B01D 61/026; B01D 61/08; B01D 61/14; B01D 63/02; B01D 2313/083; B01D 2313/18; B01D 2313/60; B08B 3/14; B08B 3/022; B08B 13/00; C02F 1/283; C02F 1/42; C02F 1/441; C02F 1/444;
(Continued)

(56) References Cited

U.S. PATENT DOCUMENTS 9,711,380 B2    7/2017   Ito et al.

FOREIGN PATENT DOCUMENTS

JP    H06296971 A    10/1994
JP    H09253623 A    9/1997
(Continued)

*Primary Examiner* — John Kim
(74) *Attorney, Agent, or Firm* — Sughrue Mion, PLLC

(57) ABSTRACT

Ultrapure water supply apparatuses, substrate processing systems, and substrate processing methods are provided. An ultrapure water supply apparatus includes: a first supply device that produces first ultrapure water; a second supply device that produces second ultrapure water; a first reserved supply device that provides the second supply device with a portion of fluid in the first supply device; and a second reserved supply device that provides the first supply device with a portion of fluid in the second supply device. The first supply device includes a first front-side filtering part, a first rear-side filtering part, and a first connection part. The second supply device includes a second front-side filtering part, a second rear-side filtering part, and a second connection part. Each of the first and second reserved supply devices connects the first connection part and the second connection part to each other.

7 Claims, 13 Drawing Sheets

(51) Int. Cl.
| | |
|---|---|
| B01D 61/02 | (2006.01) |
| B01D 61/08 | (2006.01) |
| B01D 61/14 | (2006.01) |
| B01D 63/02 | (2006.01) |
| B08B 3/02 | (2006.01) |
| B08B 3/14 | (2006.01) |
| B08B 13/00 | (2006.01) |
| C02F 1/28 | (2023.01) |
| C02F 1/42 | (2023.01) |
| C02F 1/44 | (2023.01) |
| H01L 21/67 | (2006.01) |
| C02F 103/04 | (2006.01) |
| C02F 103/34 | (2006.01) |

(52) U.S. Cl.
CPC ........... *B01D 61/026* (2022.08); *B01D 61/08* (2013.01); *B01D 61/14* (2013.01); *B01D 63/02* (2013.01); *B08B 3/022* (2013.01); *B08B 3/14* (2013.01); *B08B 13/00* (2013.01); *C02F 1/283* (2013.01); *C02F 1/42* (2013.01); *C02F 1/441* (2013.01); *C02F 1/444* (2013.01); *H01L 21/67017* (2013.01); *B01D 2313/083* (2013.01); *B01D 2313/18* (2013.01); *B01D 2313/60* (2022.08); *C02F 2103/04* (2013.01); *C02F 2103/346* (2013.01); *C02F 2201/005* (2013.01); *C02F 2209/03* (2013.01); *C02F 2209/05* (2013.01); *C02F 2209/40* (2013.01); *C02F 2301/043* (2013.01); *C02F 2301/046* (2013.01); *H01L 21/67063* (2013.01); *H01L 21/67092* (2013.01)

(58) Field of Classification Search
CPC .. C02F 9/00; C02F 2103/04; C02F 2103/346; C02F 2201/005; C02F 2209/03; C02F 2209/05; C02F 2209/40; C02F 2301/043; C02F 2301/046; H01L 21/67063; H01L 21/67092; H01L 21/67017
See application file for complete search history.

(56) References Cited

FOREIGN PATENT DOCUMENTS

| | | |
|---|---|---|
| JP | 2014075472 A | 4/2014 |
| KR | 1020020045654 A | 6/2002 |
| KR | 1020040078534 A | 9/2004 |
| KR | 100462897 B1 | 12/2004 |
| KR | 1020050022430 A | 3/2005 |
| KR | 100790736 B1 | 12/2007 |
| KR | 101164171 B1 | 7/2012 |
| KR | 1020130114616 A | 10/2013 |
| KR | 102064597 B1 | 2/2020 |
| KR | 102075674 B1 | 3/2020 |

ULTRAPURE WATER SUPPLY APPARATUS, SUBSTRATE PROCESSING SYSTEM INCLUDING THE SAME, AND SUBSTRATE PROCESSING METHOD USING THE SAME

CROSS-REFERENCE TO RELATED APPLICATION

This U.S. application claims priority under 35 U.S.C § 119 to Korean Patent Application No. 10-2022-0035146 filed on Mar. 22, 2022, in the Korean Intellectual Property Office, the disclosure of which is incorporated by reference herein in its entirety.

BACKGROUND

The present disclosure relates to an ultrapure water supply apparatus, a substrate processing system including the same, and a substrate processing method using the same, and more particularly, to an ultrapure water supply apparatus capable of stably supplying a flow rate of ultrapure water at or above a certain level, a substrate processing system including the same, and a substrate processing method using the same.

A semiconductor device may be fabricated by a series of processes. For example, the semiconductor device may be manufactured through a photolithography process, an etching process, a deposition process, a polishing process, and a cleaning process on a silicon wafer. Such processes may use ultrapure water (UPW). The ultrapure water may indicate water with low electrical conductivity and less impurity. The ultrapure water may be produced through a separate procedure. It may be required that the produced ultrapure water be supplied at or above a certain flow rate to a substrate processing apparatus.

SUMMARY

One or more embodiments of the present disclosure provide an ultrapure water supply apparatus capable of stably supplying ultrapure water to two or more semiconductor fabrication lines, a substrate processing system including the same, and a substrate processing method using the same.

One or more embodiments of the present disclosure provide an ultrapure water supply apparatus capable of continuously supplying ultrapure water with a constant quality, a substrate processing system including the same, and a substrate processing method using the same.

One or more embodiments of the present disclosure provide an ultrapure water supply apparatus capable of being prepared for some trouble of equipment, a substrate processing system including the same, and a substrate processing method using the same.

Aspects of the present disclosure are not limited to the aspects mentioned above, and other aspects which have not been mentioned above will be clearly understood to those skilled in the art from the following description.

According to an aspect of an example embodiment, an ultrapure water supply apparatus includes: a first supply device configured to produce first ultrapure water; a second supply device configured to produce second ultrapure water; a first reserved supply device configured to provide the second supply device with a portion of fluid in the first supply device; and a second reserved supply device configured to provide the first supply device with a portion of fluid in the second supply device. The first supply device includes: a first front-side filtering part; a first rear-side filtering part that is configured to filter fluid that passes through the first front-side filtering part; and a first connection part between the first front-side filtering part and the first rear-side filtering part. The second supply device includes: a second front-side filtering part; a second rear-side filtering part that is configured to filter fluid that passes through the second front-side filtering part; and a second connection part between the second front-side filtering part and the second rear-side filtering part, wherein each of the first reserved supply device and the second reserved supply device connects the first connection part and the second connection part to each other.

According to an aspect of an example embodiment, a substrate processing system includes: a first fabrication line that is configured to process a substrate; a second fabrication line spaced apart from the first fabrication line; a first supply device that is configured to supply the first fabrication line with first ultrapure water; a second supply device that is configured to supply the second fabrication line with second ultrapure water; and a reserved supply device that connects the first supply device and the second supply device to each other. The first supply device includes: a first front-side filtering part; and a first connection part that is configured to provide the first fabrication line with fluid that passes through the first front-side filtering part. The second supply device includes: a second front-side filtering part; and a second connection part that is configured to provide the second fabrication line with fluid that passes through the second front-side filtering part, wherein a first end of the reserved supply device is connected to the first connection part, and wherein a second end of the reserved supply device is connected to the second connection part.

According to an aspect of an example embodiment, a substrate processing method includes: supplying a first fabrication line with first ultrapure water; using the first ultrapure water, that is supplied to the first fabrication line, to treat a substrate on the first fabrication line; supplying a second fabrication line with second ultrapure water; and using the second ultrapure water, that is supplied to the second fabrication line, to treat a substrate on the second fabrication line. The supplying the first fabrication line with the first ultrapure water includes supplying the first ultrapure water from a first supply device to the first fabrication line. The supplying the second fabrication line with the second ultrapure water includes: supplying the second ultrapure water from a second supply device to the second fabrication line; monitoring a flow rate of the second ultrapure water supplied to the second fabrication line; and supplying, in accordance with the flow rate of the second ultrapure water supplied to the second fabrication line, water from the first supply device to the second supply device.

Details of other example embodiments are included in the description and drawings.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
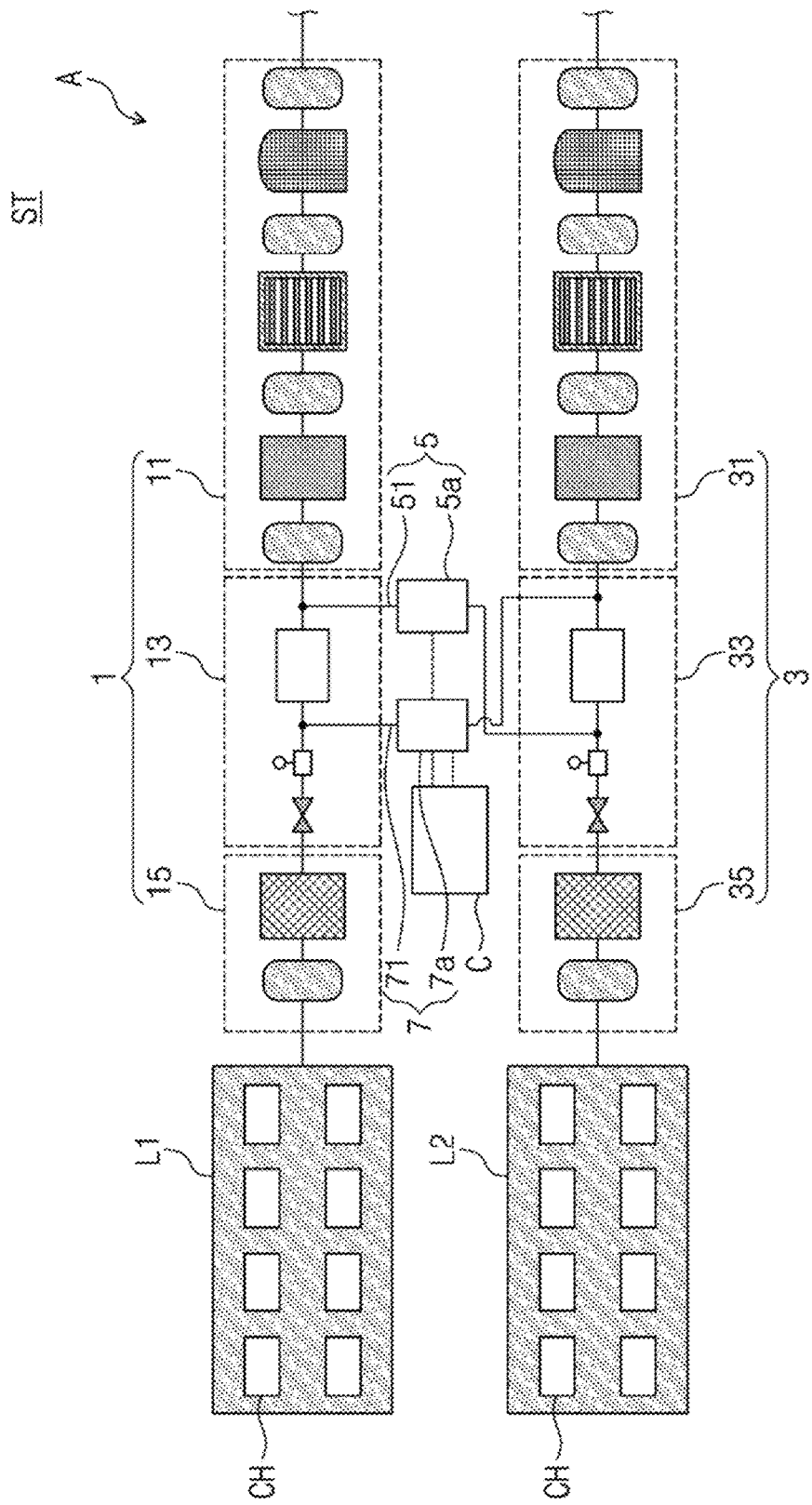
FIG. 1 illustrates a schematic diagram showing a substrate processing system according to some embodiments of the present disclosure.

Example embodiments of the present disclosure will now be described with reference to the accompanying drawings. Like reference numerals may indicate like components throughout the description and drawings.

FIG. 1 illustrates a schematic diagram showing a substrate processing system according to some embodiments of the present disclosure.

Referring to FIG. 1, a substrate processing system ST may be provided. The substrate processing system ST may be a system in which one or more processes are performed on a substrate. The substrate may include a wafer-type silicon (Si) substrate, but embodiments of the present disclosure are not limited thereto. The substrate processing system ST may be configured to execute various processes on the substrate. For example, the substrate processing system ST may carry out a polishing process, a cleaning process, and/or an etching process on the substrate. According to embodiments, such processes may include the use ultrapure water (UPW). The substrate processing system ST may include a first fabrication line L1, a second fabrication line L2, an ultrapure water supply apparatus A, and a controller C.

Each of the first fabrication line L1 and the second fabrication line L2 may be configured to perform various processes on the substrate. Each of the first fabrication line L1 and the second fabrication line L2 may include a plurality of substrate processing chambers CH. Each of the plurality of substrate processing chambers CH may be one of a substrate polishing apparatus, a substrate cleaning apparatus, and an etching apparatus. The first fabrication line L1 may be spaced apart from the second fabrication line L2. For example, the first fabrication line L1 and the second fabrication line L2 may be positioned on different floors from each other.

The ultrapure water apparatus A may provide ultrapure water to the first fabrication line L1 and the second fabrication line L2. For example, the ultrapure water supply apparatus A may produce ultrapure water from plain water and provide the ultrapure water to the first fabrication line L1 and/or the second fabrication line L2. The ultrapure water supply apparatus A may include a first supply device 1, a second supply device 3, a first reserved supply device 5, and a second reserved supply device 7.

The first supply device 1 may produce and supply ultrapure water. For example, the first supply device 1 may provide ultrapure water to the first fabrication line L1. In addition, under certain circumstances, the first supply device 1 may be used to provide ultrapure water to the second fabrication line L2. For example, according to an embodiment, the first supply device 1 may provide fluid (e.g., ultrapure water, de-ionized water, or other types of water) to a second supply device 3, which then supplies ultrapure water to the second fabrication line L2 based on such fluid. The first supply device 1 may include a first front-side filtering part 11, a first rear-side filtering part 15, and a first connection part 13.

The first front-side filtering part 11 may be provided with plain water and may filter the plain water. The first front-side filtering part 11 may include many kinds of filtering device (e.g., a filter). The plain water may be converted into de-ionized water (DIW) while passing through the first front-side filtering part 11. The first connection part 13 may receive a fluid that has passed through the first front-side filtering part 11.

The first rear-side filtering part 15 may be connected to the first front-side filtering part 11. The first rear-side filtering part 15 may re-filter a fluid that has passed through the first front-side filtering part 11. The first rear-side filtering part 15 may include a filtering device (e.g., a filter). The first fabrication line L1 may be provided with ultrapure water converted from a fluid that has passed through the first rear-side filtering part 15.

The first connection part 13 may be positioned between the first front-side filtering part 11 and the first rear-side filtering part 15. For example, the first front-side filtering part 11, the first connection part 13, and the first rear-side filtering part 15 may be connected to each other in series. The first connection part 13 may provide the first rear-side filtering part 15 with a portion of fluid that has passed through the first front-side filtering part 11. The first connection part 13 may be connected to the first reserved supply device 5 and the second reserved supply device 7. The first connection part 13 may provide the first reserved supply device 5 with another portion of fluid that has passed through the first front-side filtering part 11.

A detailed description of the first supply device 1 will be further provided below.

The second supply device 3 may be differentiated from the first supply device 1. For example, the second supply device 3 may be an instrument independent of the first supply device 1. The second supply device 3 may produce and supply ultrapure water. For example, the second supply device 3 may provide the ultrapure water to the second fabrication line L2. In addition, under certain circumstances, the second supply device 3 may be used to provide ultrapure water to the first fabrication line L1. For example, according to an embodiment, the second supply device 3 may provide fluid (e.g., ultrapure water, de-ionized water, or other types of water) to the first supply device 1, which then supplies ultrapure water to the first fabrication line L1 based on such fluid. The second supply device 3 may include a second front-side filtering part 31, a second rear-side filtering part 35, and a second connection part 33.

The second front-side filtering part 31 may be provided with plain water and may filter the plain water. The second front-side filtering part 31 may include many kinds of filtering device (e.g., a filter). The plain water may be converted into de-ionized water (DIW) while passing through the second front-side filtering part 31. The second connection part 33 may receive a fluid that has passed through the second front-side filtering part 31.

The second rear-side filtering part 35 may be connected to the second front-side filtering part 31. The second rear-side filtering part 35 may re-filter a fluid that has passed through the second front-side filtering part 31. The second rear-side filtering part 35 may include a filtering device (e.g., a filter). The second fabrication line L2 may be provided with ultrapure water converted from a fluid that has passed through the second rear-side filtering part 35.

The second connection part 33 may be positioned between the second front-side filtering part 31 and the second rear-side filtering part 35. For example, the second front-side filtering part 31, the second connection part 33, and the second rear-side filtering part 35 may be connected to each other in series. The second connection part 33 may provide the second rear-side filtering part 35 with a portion of fluid that has passed through the second front-side filtering part 31. The second connection part 33 may be connected to the first reserved supply device 5 and the second reserved supply device 7. The second connection part 33 may provide the second reserved supply device 7 with another portion of fluid that has passed through the second front-side filtering part 31.

The first reserved supply device 5 may connect the first supply device 1 to the second supply device 3. For example, the first reserved supply device 5 may connect the first connection part 13 to the second connection part 33. A portion of fluid that has passed through the first front-side filtering part 11 may be provided through the first reserved supply device 5 to the second fabrication line L2. The first reserved supply device 5 may include a first reserved pipe 51 and a first reserved bypass device 5a. A detailed description thereof will be further provided below.

The second reserved supply device 7 may connect the second supply device 3 to the first supply device 1. For example, the second reserved supply device 7 may connect the second connection part 33 to the first connection part 13. A portion of fluid that has passed through the second front-side filtering part 31 may be provided through the second reserved supply device 7 to the first fabrication line L1. The second reserved supply device 7 may include a second reserved pipe 71 and a second reserved bypass device 7a. A detailed description thereof will be further provided below.

The controller C may control the ultrapure water supply apparatus A. For example, the controller C may receive signals from the first connection part 13 and/or the second connection part 33 and may control the first reserved supply device 5 and/or the second reserved supply device 7. For more detail, when there is a signal to indicate a shortage in flow rate of fluid supplied from the second connection part 33 to the second rear-side filtering part 35, the controller C may control the first reserved supply device 5 to allow the second fabrication line L2 to receive a portion of fluid discharged from the first front-side filtering part 11. A detailed description thereof will be further provided below.

According to embodiments, the controller C may include at least one processor and memory storing computer instructions. The computer instructions, when executed by the at least one processor, may cause the at least one processor to perform the functions of the controller C. For example, the functions may include the control functions described herein, including the control functions described with reference to FIG. 8.

Figure 2:
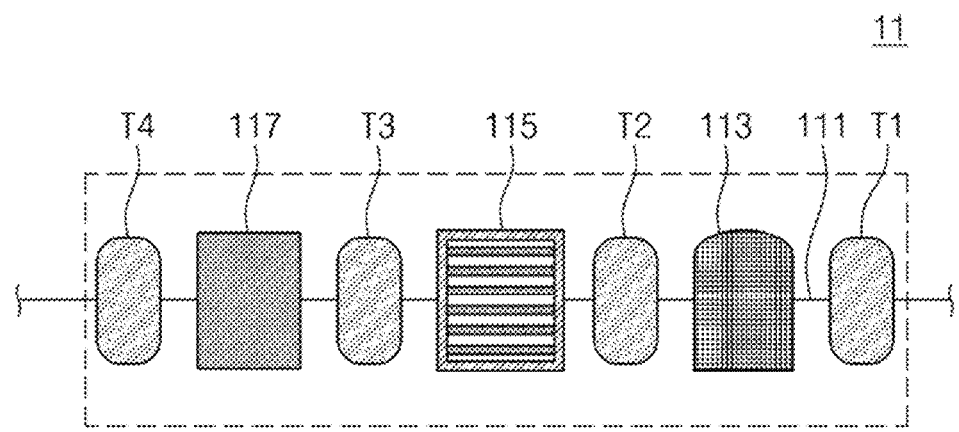
FIG. 2 illustrates an enlarged schematic diagram showing a first front-side filtering part in the substrate processing system of FIG. 1.

FIG. 2 illustrates an enlarged schematic diagram showing a first front-side filtering part in the substrate processing system of FIG. 1.

Referring to FIG. 2, the first front-side filtering part 11 may include a plurality of filtering devices. For example, the first front-side filtering part 11 may include a first filtering device 113, a second filtering device 115, and a third filtering device 117. Each of the first filtering device 113, the second filtering device 115, and the third filtering device 117 may include one of an activated carbon filter device, an ion exchange resin device, a reverse osmosis membrane device, and a hollow fiber membrane device. The plurality of filtering devices may be connected to each other in series. The plurality of filtering devices may be connected to each other through a first front-side filtering pipe 111. A buffer tank may be provided between the plurality of filtering devices. For example, a first tank T1 may be positioned in front of the first filtering device 113. A second tank T2 may be positioned between the first filtering device 113 and the second filtering device 115. A third tank T3 may be positioned between the second filtering device 115 and the third filtering device 117. A fourth tank T4 may be positioned behind the third filtering device 117.

Plain water supplied from outside may be filtered while passing through the plurality of filtering devices. For example, fluid that has passed through the plurality of filtering devices may be converted into de-ionized water (DIW).

According to embodiments of the present disclosure, the second front-side filtering part 31 may have a same or similar configuration as the first front-side filtering part 11. Accordingly, an example configuration of the second front-side filtering part 31 may be understood based on FIG. 2.

Figure 3:
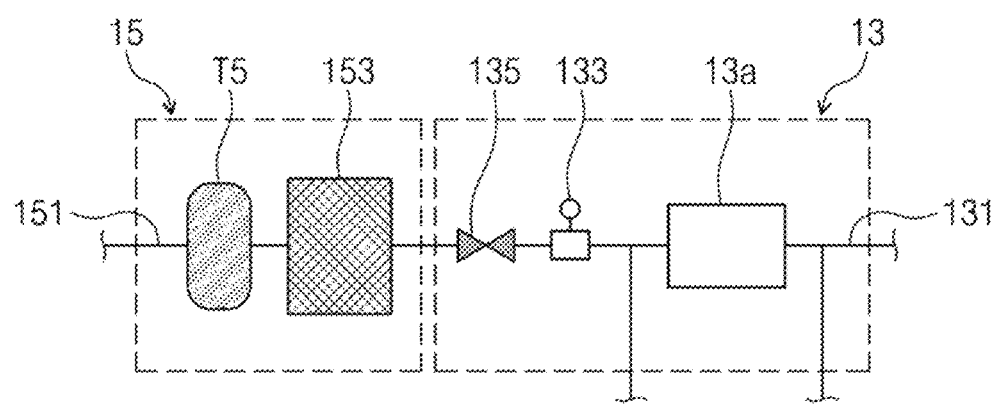
FIG. 3 illustrates an enlarged schematic diagram showing a first connection part and a first rear-side filtering part in the substrate processing system of FIG. 1.

FIG. 3 illustrates an enlarged schematic diagram showing a first connection part and a first rear-side filtering part in the substrate processing system of FIG. 1.

Referring to FIG. 3, the first connection part 13 may include a first connection pipe 131, a first connection bypass device 13a, a first connection valve 135, and a first flow meter 133.

The first connection pipe 131 may connect the first front-side filtering part 11 (refer to FIG. 2) to the first rear-side filtering part 15.

The first connection bypass device 13a may be coupled to the first connection pipe 131. The first connection bypass device 13a may provide a path that bypasses the first connection pipe 131. Therefore, it may be possible to prepare for trouble of some devices. Alternatively, the first connection bypass device 13a may be used for the flushing. A detailed description thereof will be further provided below.

The first connection valve 135 may be positioned on the first connection pipe 131. The first connection valve 135 may control a flow rate of fluid in the first connection pipe 131. The first connection valve 135 may include a level control valve (LCV), but embodiments of the present disclosure are not limited thereto.

The first flow meter 133 may be positioned on the first connection pipe 131. The first flow meter 133 may be disposed adjacent to the first connection valve 135. For example, the first flow meter 133 may be positioned in front of the first connection valve 135. The first flow meter 133 may detect a flow rate of fluid that flows in the first connection pipe 131. The first flow meter 133 may include a mass flow meter (MFC). Embodiments of the present disclosure, however, are not limited thereto, and the first flow meter 133 may include various devices capable of measuring a flow rate of fluid. The first flow meter 133 may provide the controller C (refer to FIG. 1) with information of a flow rate of fluid that flows in the first connection pipe 131. According to embodiments, the controller C may receive the information via a wired or wireless connection between the first flow meter 133 and the controller C.

The first rear-side filtering part 15 may include a first rear-side filtering pipe 151, a first rear-side filtering device 153, and a fifth tank T5. The first rear-side filtering pipe 151 may be connected to the first connection pipe 131. The first rear-side filtering device 153 may be positioned on the first rear-side filtering pipe 151. The first rear-side filtering device 153 may include an instrument capable of filtering fluid. For example, the first rear-side filtering device 153 may include one of an activated carbon filter device, an ion exchange resin device, a reverse osmosis membrane device, and a hollow fiber membrane device. The fifth tank T5 may be positioned behind the first rear-side filtering device 153. Fluid that has passed through the first rear-side filtering part 15 may be converted into ultrapure water. The ultrapure water may be provided to the first fabrication line L1 (refer to FIG. 1).

Figure 4:
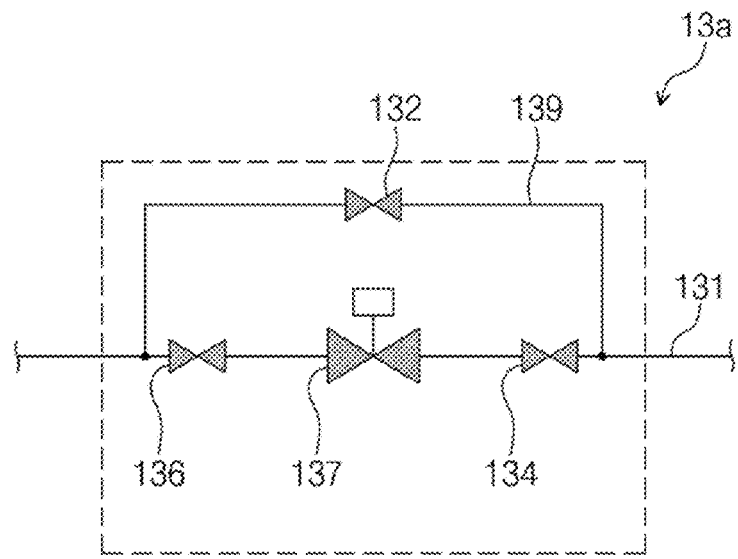
FIG. 4 illustrates an enlarged schematic diagram partially showing the first connection part of FIG. 3.

FIG. 4 illustrates an enlarged schematic diagram partially showing the first connection part of FIG. 3.

Referring to FIG. 4, the first connection bypass device 13a may include a first valve 137, a first connection bypass pipe 139, a first connection bypass valve 132, and first connection shutoff valves 134 and 136.

The first valve 137 may be positioned on the first connection pipe 131. The first valve 137 may control a flow rate of fluid that flows in the first connection pipe 131. The first valve 137 may include an automatic valve. In this case, the first valve 137 may be automatically opened and closed by the controller C (refer to FIG. 1).

The first connection bypass pipe 139 may be connected to the first connection pipe 131. The first connection bypass pipe 139 may bypass the first valve 137. For example, one end of the first connection bypass pipe 139 may be connected to the first connection pipe 131 in front of the first valve 137, and another end of the first connection bypass pipe 139 may be connected to the first connection pipe 131 behind the first valve 137.

The first connection bypass valve 132 may be positioned on the first connection bypass pipe 139. The first connection bypass valve 132 may include a manual valve, but embodiments of the present disclosure are not limited thereto.

The first connection shutoff valves 134 and 136 may be positioned on the first connection pipe 131. For example, the first connection shutoff valves 134 and 136 may be coupled onto the first connection pipe 131 between the first valve 137 and the first connection bypass pipe 139. Two first connection shutoff valves 134 and 136 may be provided. One of the two first connection shutoff valves 134 and 136 may be positioned in front of the first valve 137, and the other of the two first connection shutoff valves 134 and 136 may be positioned behind the first valve 137. When the first connection shutoff valves 134 and 136 are closed, no fluid may move to the first valve 137. In this case, when the first connection bypass valve 132 is opened, fluid may move through the first connection bypass pipe 139. When the first valve 137 is in an abnormal state, the first connection shutoff valves 134 and 136 may be closed and the first connection bypass valve 132 is opened, wherein such valve operation may cause fluid to flow through the first connection bypass pipe 139. During the bypass of fluid, the first valve 137 may be repaired.

According to embodiments of the present disclosure, the second connection part 33 may have a same or similar configuration as the first connection part 13. Accordingly, an example configuration of the second connection part 33 may be understood based on FIGS. 3-4.

Figure 5:
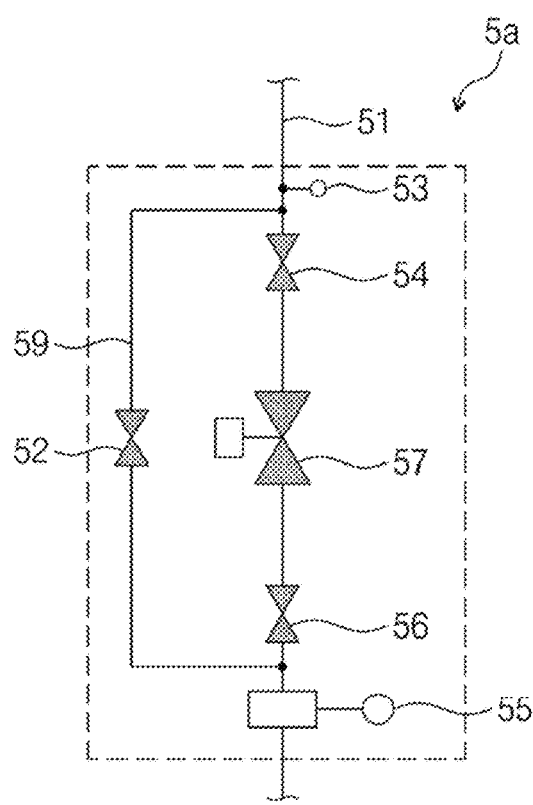
FIG. 5 illustrates an enlarged schematic diagram showing a first reserved supply device.

FIG. 5 illustrates an enlarged schematic diagram showing a first reserved supply device.

Referring to FIGS. 1, 3, and 5, one end of the first reserved pipe 51 may be connected to the first connection pipe 131. In addition, another end of the first reserved pipe 51 may be connected to a second connection pipe (not designated by reference numeral) of the second connection part 33.

Referring to FIG. 5, the first reserved bypass device 5a may include a first reserved valve 57, a first bypass pipe 59, a first bypass valve 52, first shutoff valves 54 and 56, a first resistivity meter 53, and a first pressure sensor 55.

The first reserved valve 57 may be positioned on the first reserved pipe 51. The first reserved valve 57 may control a flow rate of fluid that flows in the first reserved pipe 51. The first reserved valve 57 may include an automatic valve. In this case, the first reserved valve 57 may be automatically opened and closed by the controller C (refer to FIG. 1).

The first bypass pipe 59 may be connected to the first reserved pipe 51. The first bypass pipe 59 may bypass the first reserved valve 57. For example, one end of the first bypass pipe 59 may be connected to the first reserved pipe 51 in front of the first reserved valve 57, and another end of the first bypass pipe 59 may be connected to the first reserved pipe 51 behind the first reserved valve 57.

The first bypass valve 52 may be positioned on the first bypass pipe 59. The first bypass valve 52 may include a manual valve, but embodiments of the present disclosure are not limited thereto.

The first shutoff valves 54 and 56 may be positioned on the first reserved pipe 51. For example, the first shutoff valves 54 and 56 may be coupled onto the first reserved pipe 51 between the first reserved valve 57 and the first bypass pipe 59. Two first shutoff valves 54 and 56 may be provided. One of the two first shutoff valves 54 and 56 may be positioned in front of the first reserved valve 57, and the other of the two first shutoff valves 54 and 56 may be positioned behind the first reserved valve 57. When the first shutoff valves 54 and 56 are closed, no fluid may move to the first reserved valve 57. In this case, when the first bypass valve 52 is opened, fluid may move through the first bypass pipe 59.

The first resistivity meter 53 may be positioned on the first reserved pipe 51. The first resistivity meter 53 may measure resistivity of fluid that flows in the first reserved pipe 51. When resistivity of fluid is measured, it may be possible to obtain quality of ultrapure water. For example, the first resistivity meter 53 may detect quality of fluid. The controller C (refer to FIG. 1) may receive information of resistivity measured by the first resistivity meter 53. According to embodiments, the controller C may receive the information via a wired or wireless connection between the first resistivity meter 53 and the controller C.

The first pressure sensor 55 may be positioned on the first reserved pipe 51. The first pressure sensor 55 may measure a pressure of fluid that flows in the first reserved pipe 51. The first pressure sensor 55 may include a primary pressure gauge such as manometer or barometer, a secondary pressure gauge such as Bourdon tube pressure gauge, and a pressure transmitter. Embodiments of the present disclosure, however, are not limited thereto, and the first pressure sensor 55 may include any other suitable configurations capable of measuring and transferring a pressure of fluid in the first reserved pipe 51. When a pressure of fluid in the first reserved pipe 51 is lower than atmospheric pressure, the first pressure sensor 55 may transfer an abnormal signal to the controller C. In this case, certain measures may be taken to raise a pressure of fluid in the first reserved pipe 51. A detailed description thereof will be further provided below. According to embodiments, the controller C may receive signals from the first pressure sensor 55 via a wired or wireless connection between the first pressure sensor 55 and the controller C.

According to embodiments of the present disclosure, the second reserved bypass device 7a may have a same or similar configuration as the first reserved bypass device 5a. Accordingly, an example configuration of the second reserved bypass device 7a may be understood from based on FIG. 5.

Figure 6:
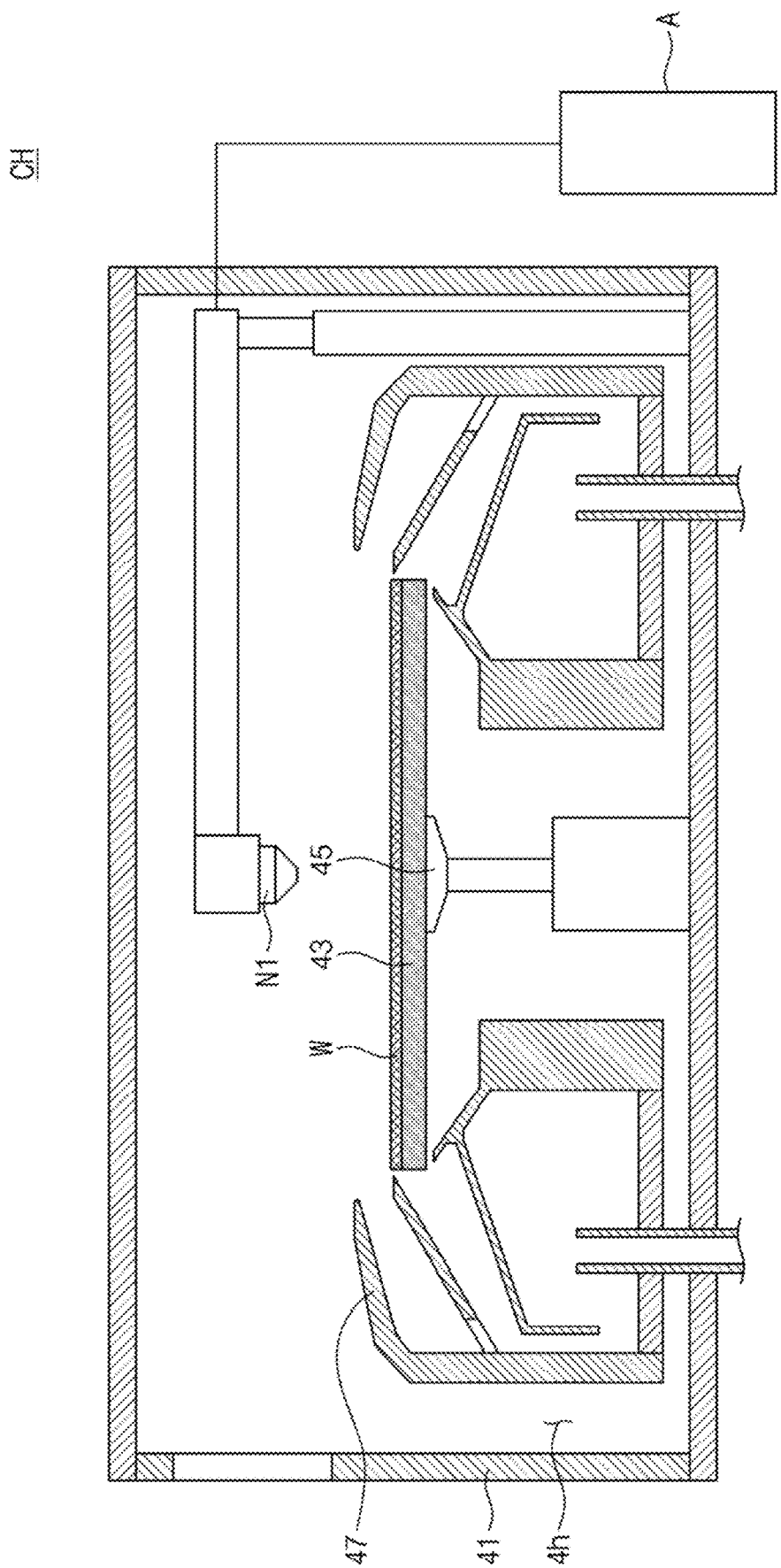
FIG. 6 illustrates a cross-sectional view showing an example of a substrate processing chamber in a substrate processing system according to some embodiments of the present disclosure.

FIG. 6 illustrates a cross-sectional view showing an example of a substrate processing chamber in a substrate processing system according to some embodiments of the present disclosure.

Referring to FIG. 6, the substrate processing chamber CH may include a substrate cleaning apparatus. In this case, the substrate processing chamber CH may include a cleaning chamber 41, a cleaning stage 43, a rotational driving mechanism 45, a cleaning nozzle N1, and a cleaning bowl 47.

The cleaning chamber 41 may provide a cleaning space 4h. A cleaning process may be performed on a substrate W in the cleaning chamber 41.

The cleaning stage 43 may be positioned in the cleaning chamber 41. The cleaning stage 43 may support the substrate W.

The rotational driving mechanism 45 may rotate the cleaning stage 43. Therefore, the substrate W may rotate on the cleaning stage 43 that rotates. According to embodiments, the rotational driving mechanism 45 may include, for example, an actuator (e.g., a motor) that causes the cleaning stage 43 to rotate.

The cleaning nozzle N1 may be disposed upwardly spaced apart from the cleaning stage 43. The cleaning nozzle N1 may be connected to the ultrapure water supply apparatus A. Ultrapure water may be supplied from the ultrapure water supply apparatus A to the cleaning nozzle N1, thereby being sprayed onto the substrate W. The substrate W on the cleaning stage 43 may be cleaned by the ultrapure water sprayed from the cleaning nozzle N1. In this case, the cleaning stage 43 and the substrate W thereon may rotate due to the rotational driving mechanism 45. The ultrapure water in contact with a top surface of the substrate W may be pushed outwardly.

The cleaning bowl 47 may surround the cleaning stage 43. The cleaning bowl 47 may collect the ultrapure water that is outwardly pushed from the top surface of the substrate W.

Figure 7:
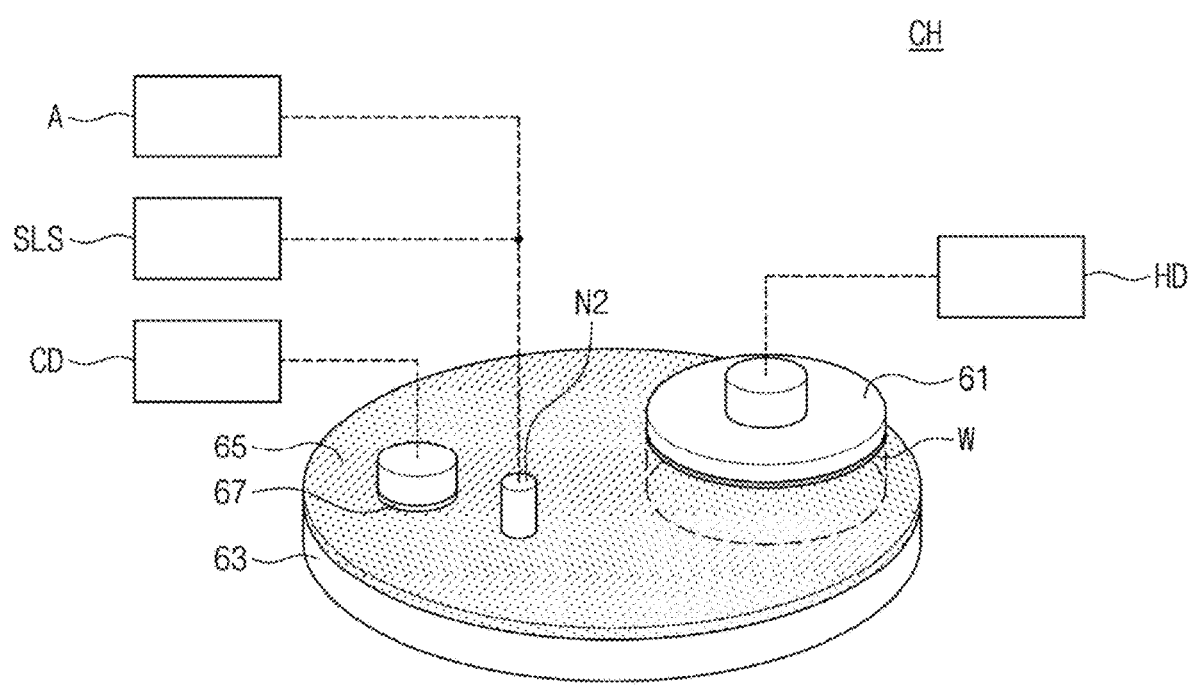
FIG. 7 illustrates a schematic perspective view showing an example of a substrate processing chamber in a substrate processing system according to some embodiments of the present disclosure.

FIG. 7 illustrates a schematic perspective view showing an example of a substrate processing chamber in a substrate processing system according to some embodiments of the present disclosure.

Referring to FIG. 7, the substrate processing chamber CH may include a substrate polishing apparatus. In this case, the substrate processing chamber CH may include a polishing head 61, a polishing stage 63, a polishing pad 65, a conditioning disk 67, a head driving part HD, a conditioning driving part CD, a slurry supply part SLS, and a polishing nozzle N2.

The polishing head 61 may support the substrate W. The polishing pad 65 may polish the substrate W supported by the polishing head 61. The polishing stage 63 may rotate the polishing pad 65. The polishing pad 65 may polish one surface of the substrate W while being in contact with the substrate W. The conditioning disk 67 may improve a condition of a top surface of the polishing pad 65. For example, the conditioning disk 67 may polish the top surface of the polishing pad 65. The head driving part HD may rotate and/or translate the polishing head 61. According to embodiments, the head driving part HD may include at least one actuator (e.g., a motor) to cause rotation and/or translation of the polishing head 61. The conditioning driving part CD may drive the conditioning disk 67 to move. According to embodiments, the conditioning driving part CD may include at least one actuator (e.g., a motor) to drive the conditioning disk 67 to move. The slurry supply part SLS may supply the polishing nozzle N2 with slurry. The polishing nozzle N2 may be connected to the slurry supply part SLS and the ultrapure water supply apparatus A. The ultrapure water supply apparatus A may supply the polishing nozzle N2 with ultrapure water. The polishing nozzle N2 may mix the slurry supplied from the slurry supply part SLS with the ultrapure water supplied from the ultrapure water supply apparatus A, and may spray the mixture onto the polishing pad 65.

FIGS. 6 and 7 show that the substrate processing chamber CH may be a substrate cleaning apparatus or a substrate polishing apparatus, but embodiments of the present disclosure are not limited thereto. For example, the substrate processing chamber CH may include any other apparatus in which ultrapure water is used to perform a treatment process on a substrate.

Figure 8:
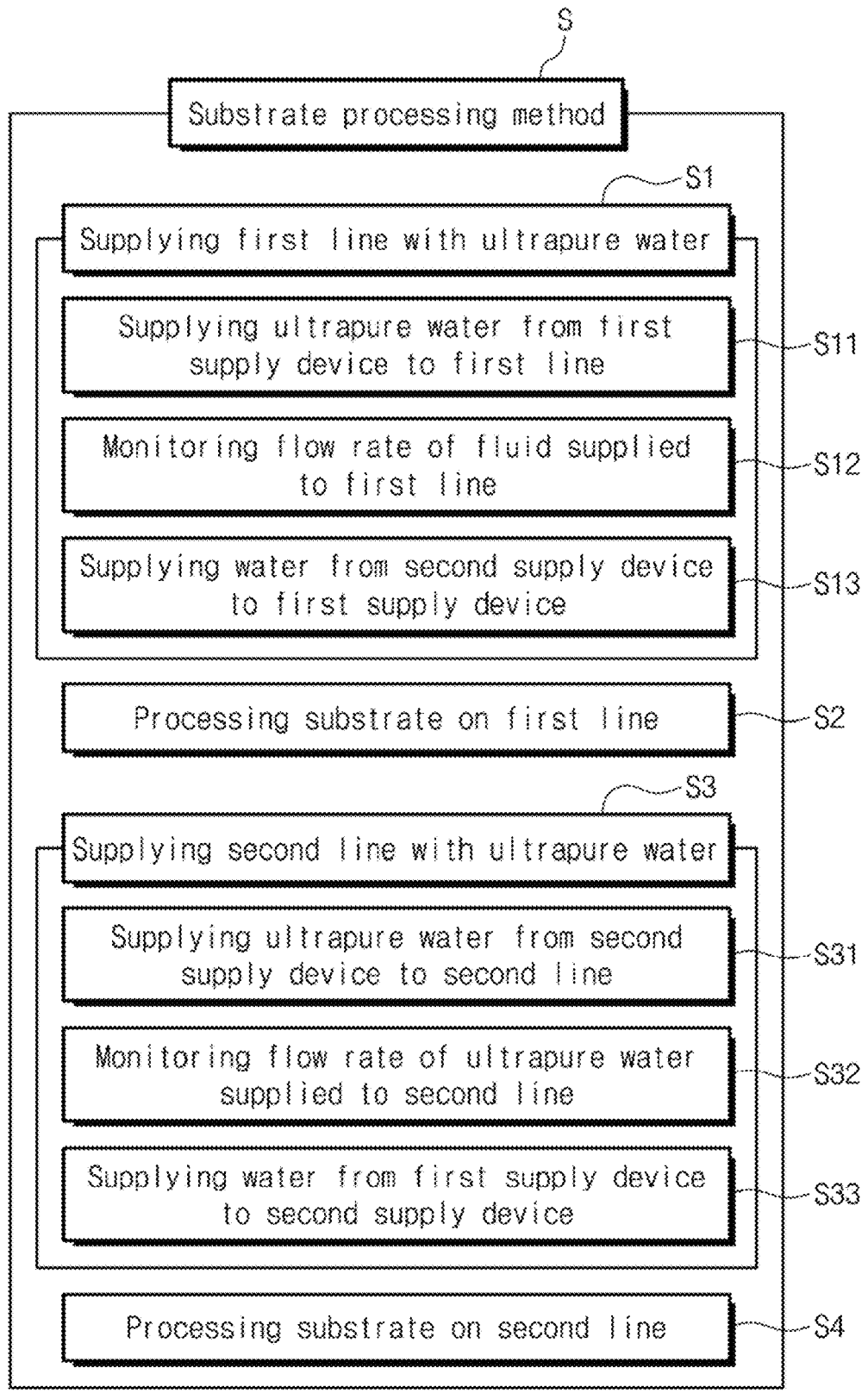
FIG. 8 illustrates a flow chart showing a substrate processing method according to some embodiments of the present disclosure.
Figure 9:
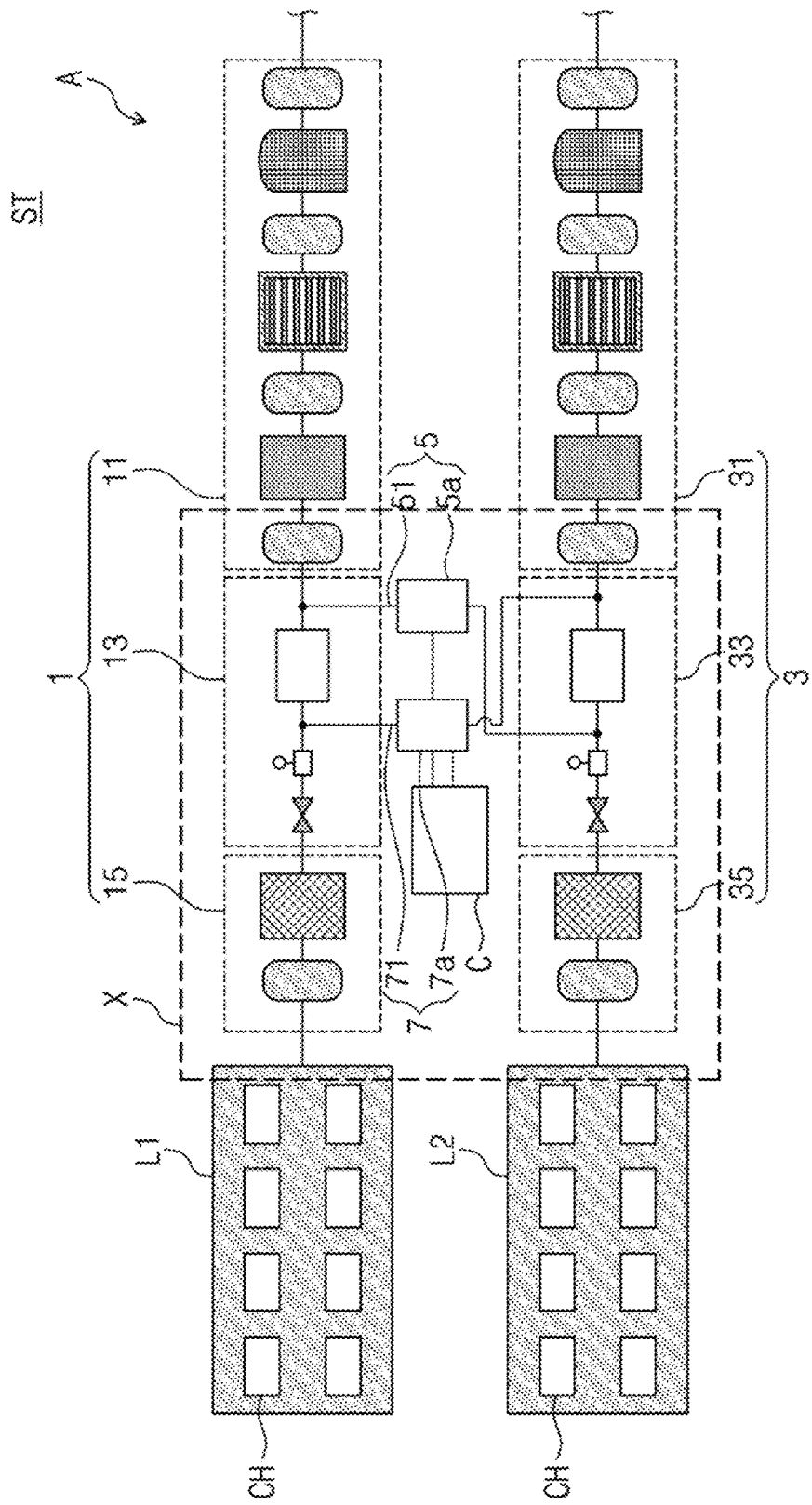
FIG. 9 is a first schematic diagram showing the substrate processing method according to the flow chart of FIG. 8.
Figure 10:
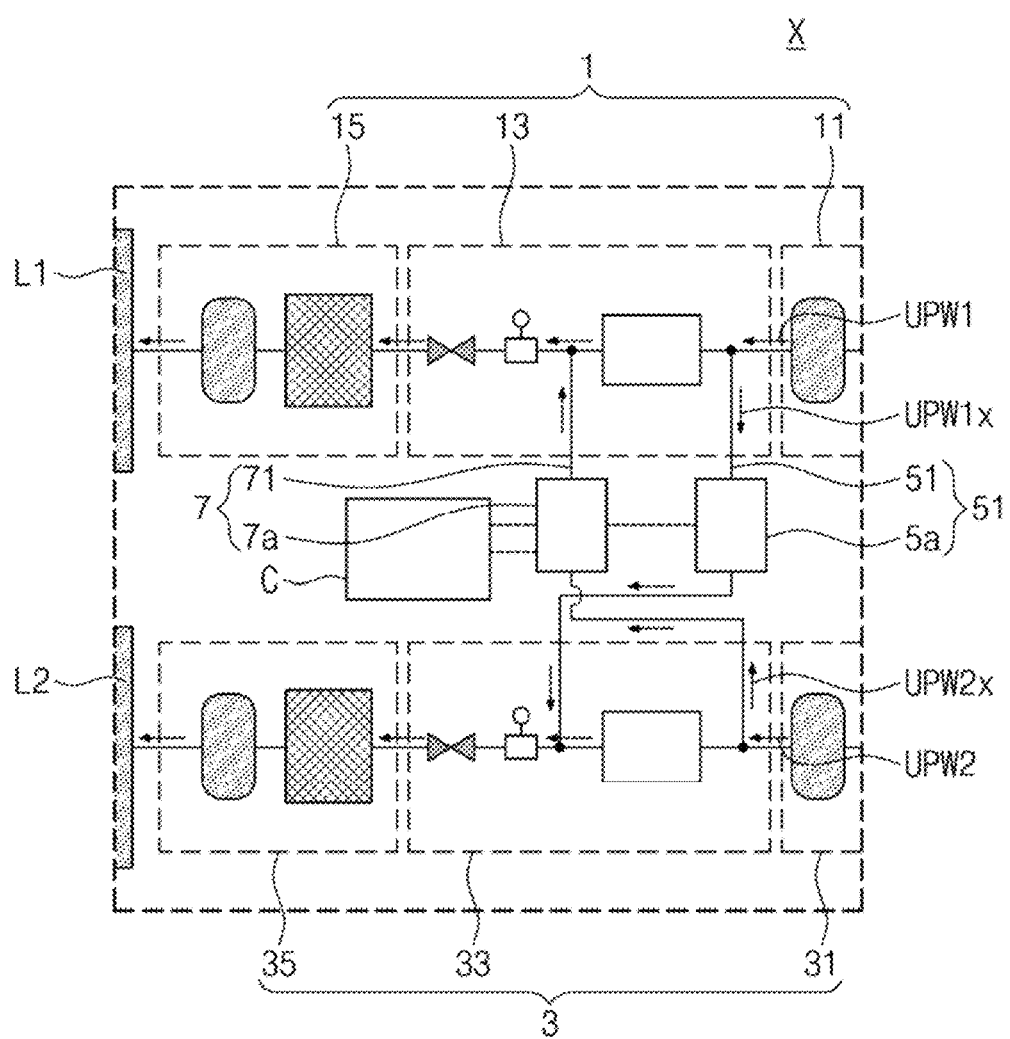
FIG. 10 is a second schematic diagram showing the substrate processing method according to the flow chart of FIG. 8.

FIG. 8 illustrates a flow chart showing a substrate processing method according to some embodiments of the present disclosure.

Referring to FIG. 8, a substrate processing method S may be provided. The substrate processing method S may be a method in which a substrate is treated using the substrate processing system ST discussed with reference to FIGS. 1 to 7. The substrate processing method S may include a step S1 of supplying a first fabrication line with ultrapure water, a step S2 of processing a substrate on the first fabrication line, a step S3 of supplying a second fabrication line with ultrapure water, and a step S4 of processing the substrate on the second fabrication line.

The step S1 may include a step S11 of supplying ultrapure water from a first supply device to the first fabrication line, a step S12 of monitoring a flow rate of ultrapure water supplied to the first fabrication line, and a step S13 of supplying water from a second supply device to the first supply device, such that the first supply device supplies the ultrapure water to the first fabrication line based on the water supplied to first supply device from the second supply device.

The step S3 may include a step S31 of supplying ultrapure water from the second supply device to the second fabrication line, a step S32 of monitoring a flow rate of ultrapure water supplied to the second fabrication line, and a step S33 of supplying water from the first supply device to the second supply device, such that the second supply device supplies the ultrapure water to the second fabrication line based on the water supplied to the second supply device from the first supply device.

It is shown that the steps of FIG. 8 are sequentially performed, but embodiments of the present disclosure are not limited thereto. For example, the steps of FIG. 8 may be executed at the same time, or may be performed in a reverse sequence.

The substrate processing method S of FIG. 8 will be discussed in detail below with reference to FIGS. 9 to 13.

FIGS. 9 to 13 illustrate schematic diagrams showing a substrate processing method according to the flow chart of FIG. 8.

Referring to FIGS. 8, 9, 10, and 11, the step S11 may include allowing a first fluid UPW1 that has passed through the first front-side filtering part 11 to enter the first fabrication line L1 after sequentially passing through the first connection part 13 and the first rear-side filtering part 15. The first fluid UPW1 may pass through the first rear-side filtering part 15 and may become ultrapure water.

The step S12 may include allowing the first flow meter 133 (refer to FIG. 3) of the first connection part 13 to measure a flow rate of fluid in the first connection pipe 131. The controller C may be provided with information of a flow rate of fluid in the first connection pipe 131. When a flow rate of fluid in the first connection pipe 131 is equal to or greater than a certain value, the controller C may determine that it is in a normal operating state.

Figure 11:
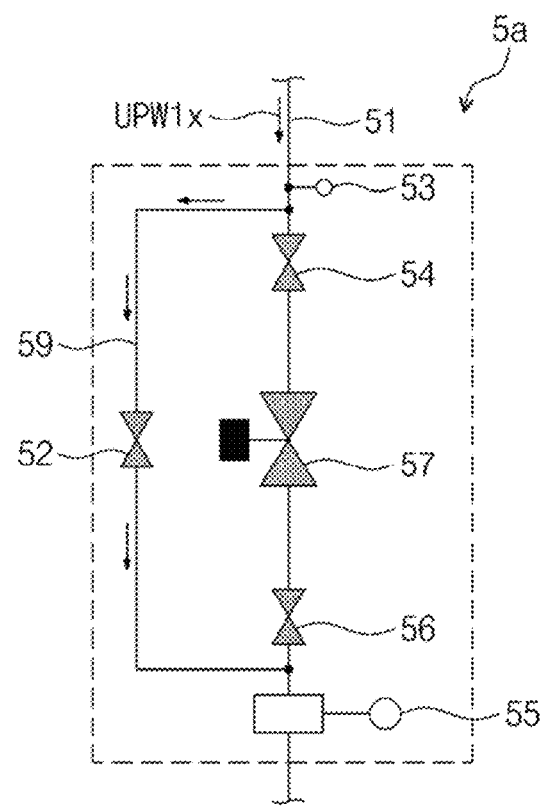
FIG. 11 is a third schematic diagram showing the substrate processing method according to the flow chart of FIG. 8.

Referring to FIG. 11, the first reserved valve 57 may be controlled by the controller C to be closed based on the controller C determining that the normal operating state exists. Therefore, no fluid may pass through the first reserved valve 57. In contrast, the first bypass valve 52 may be may be controlled by the controller C to be partially opened based on the controller C determining that the normal operating state exists. Thus, after passing through the first front-side filtering part 11 (refer to FIG. 10), a portion UPW1x of the first fluid UPW1 (refer to FIG. 10) may move through the first reserved supply device 5 to the second supply device 3 in the step s33. For example, the portion UPW1x of the first fluid UPW1 may pass through the first bypass valve 52 while moving along the first bypass pipe 59, and may then enter the second reserved supply device 7. The step S33 may be performed even in a normal operating state. In this case, the portion UPW1x of the first fluid UPW1 may flow at a relatively low rate.

In brief, the step S31 may be similar to the step S11. For example, a second fluid UPW2 that has passed through the second front-side filtering part 31 may be provided to the second fabrication line L2 after sequentially passing through the second connection part 33 and the second rear-side filtering part 35.

The step S32 may be similar to the step S12.

The step S13 may be similar to the step S33. For example, after passing through the second front-side filtering part 31 (refer to FIG. 10), a portion UPW2x of the second fluid UPW2 (refer to FIG. 10) may move through the second reserved supply device 7 to the first supply device 1. In brief, the step S13 may be performed even in a normal operating state. In this case, the portion UPW2x of the second fluid UPW2 may flow at a relatively low rate.

When a flow rate of fluid in the first connection pipe 131 is equal to or greater than the certain value or another certain value, the controller C may determine that it is in a normal operating state.

Figure 12:
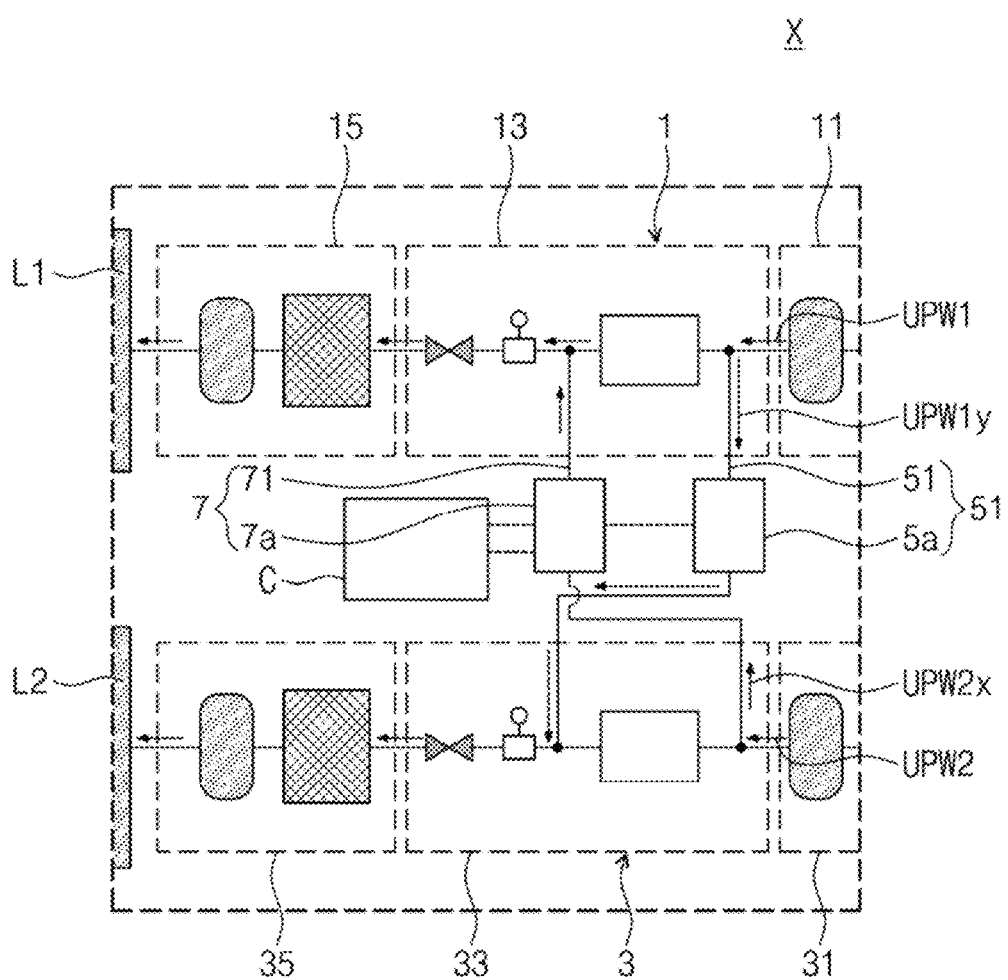
FIG. 12 is a fourth schematic diagram showing the substrate processing method according to the flow chart of FIG. 8.
Figure 13:
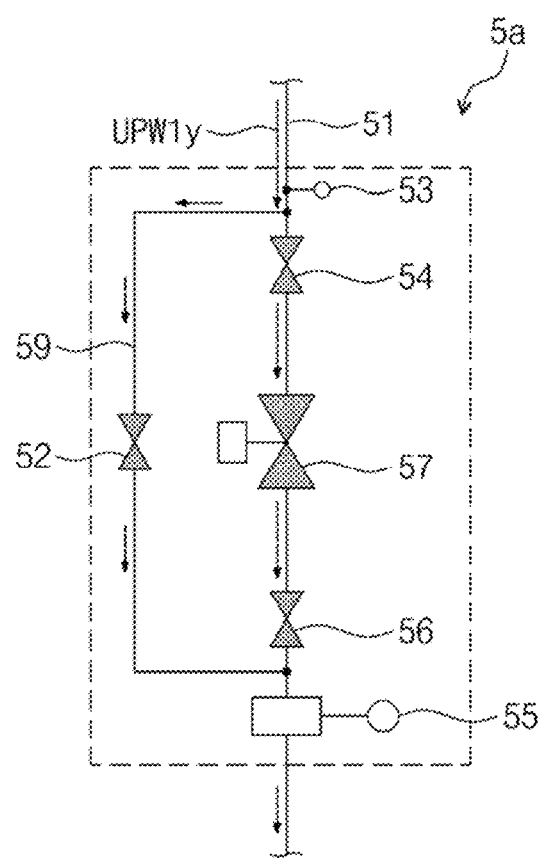
FIG. 13 is a fifth schematic diagram showing the substrate processing method according to the flow chart of FIG. 8.

Referring to FIGS. 12 and 13, the first reserved valve 57 may be controlled by the controller C to be opened based on the controller C determining that an abnormal operating state exists. Therefore, fluid may pass through the first reserved valve 57. The first bypass valve 52 may partially be still opened in an abnormal operating state. Thus, after passing through the first front-side filtering part 11 (refer to FIG. 10), a portion UPW1y of the first fluid UPW1 (refer to FIG. 10) may move through the first reserved supply device 5 to the second supply device 3 in the step S33. For example, the portion UPW1y of the first fluid UPW1 may pass through the first reserved valve 57 while moving along the first reserved pipe 51, and may then enter the second reserved supply device 7. In brief, the step S33 may be performed even in an abnormal operating state. In this case, because the first reserved valve 57 is opened, the portion UPW1y of the first fluid UPW1 may flow at a relatively high rate.

Even in a case that a flow rate of fluid in the second connection part 33 is equal to or less than the certain value or another certain value, it may be similar to that mentioned above. For example, in such a case, the controller C may open the first reserved valve 57 to supply the second fabrication line L2 with ultrapure water by supplying the portion UPW1y of the first fluid UPW1 to the second supply device 3 from the first supply device 1.

As discussed above, the step S13 may be performed differently based on a flow rate of ultrapure water supplied to the first fabrication line L1. In addition, the step S33 may be performed differently based on a flow rate of ultrapure water supplied to the second fabrication line L2. Therefore, when a certain one supply device is in trouble, a line connected to the supply device in trouble may be supplied with ultrapure water at a sufficient flow rate based on supply from all of two supply devices.

In some embodiments, the step S33 may further include allowing (or controlling) the first reserved valve 57 to close regardless of a flow rate of ultrapure water supplied to the second fabrication line L2 when an open time length of the first reserved valve 57 is beyond a certain time duration. Therefore, it may be possible to prevent deficiency of ultrapure water supplied to the first fabrication line L1.

In some embodiments, the step S33 may further include allowing (or controlling) the first reserved valve 57 to close and the first bypass valve 52 to completely open when the first reserved valve 57 is in trouble in an abnormal operating state. For example, it may be required that fluid be supplied from the first supply device 1 to the second fabrication line L2 in a case where an abnormal operating state is detected, but when the first reserved valve 57 is in trouble, the first bypass valve 52 may be fully opened to cause the second fabrication line L2 to receive ultrapure water at a sufficient flow rate by supplying the portion UPW1y of the first fluid UPW1 through the first bypass pipe 59. During this procedure, the first reserved valve 57 may be repaired.

The step S33 may further include monitoring a pressure in the first reserved pipe 51 by the first pressure sensor 55. When a pressure of fluid in the first reserved pipe 51 is lower than atmospheric pressure, the first pressure sensor 55 may transfer an abnormal signal to the controller C. In this case, one of the first bypass valve 52 and the first reserved valve 57 may be more opened by the controller C. Therefore, a pressure of fluid in the first reserved pipe 51 may be maintained at a certain level or higher. For example, a pressure of the first reserved pipe 51 may be prevented from becoming lower than atmospheric pressure. The first reserved pipe 51 may always maintain its positive pressure therein. Thus, an inside of the first reserved pipe 51 may be prevented from being contaminated due to leakage of external matter into the first reserved pipe 51.

Referring back to FIGS. 6, 7, and 8, each of the steps S2 and S4 may include cleaning the substrate W with ultrapure water supplied to the cleaning chamber 41. Alternatively, each of the steps S2 and S4 may include polishing the substrate W with ultrapure water supplied to a substrate polishing apparatus.

According to an ultrapure water supply apparatus, a substrate processing system including the same, and a substrate processing method using the same in accordance with some embodiments of the present disclosure, ultrapure water may be stably supplied to two or more semiconductor fabrication lines. For example, when a flow rate of fluid supplied is reduced due to abnormality of one supply device, another supply device may be used such that the flow rate of fluid may be maintained at a certain value or higher. Therefore, it may be possible to minimize damage to a substrate on a line.

According to an ultrapure water supply apparatus, a substrate processing system including the same, and a substrate processing method using the same in accordance with some embodiments of the present disclosure, it may be possible to bypass fluid in preparation for some trouble of equipment. For example, when a certain valve is in trouble, fluid may be bypassed to flow through a bypass valve to obtain a time required for repair of the valve.

According to an ultrapure water supply apparatus, a substrate processing system including the same, and a substrate processing method using the same in accordance with some embodiments of the present disclosure, a valve may be partially opened to allow fluid to flow through a bypass pipe on a reserved supply device, and thus the fluid may flow in a pipe even in a normal operating state. Therefore, any pipe may be prevented from being contaminated in a normal operating state, and quality of ultrapure water supplied in an abnormal operating state may be maintained at a certain level or higher. Ultrapure water may be water much cleaner than normal de-ionized water (DIW), and the presence of impurity in water may induce damage to a substrate. Therefore, according to embodiments of the present disclosure, a reserved supply device may be always flushed to supply ultrapure water at a certain level or higher in an abnormal operating state. In addition, a resistivity meter may be used to monitor quality of ultrapure water.

Figure 14:
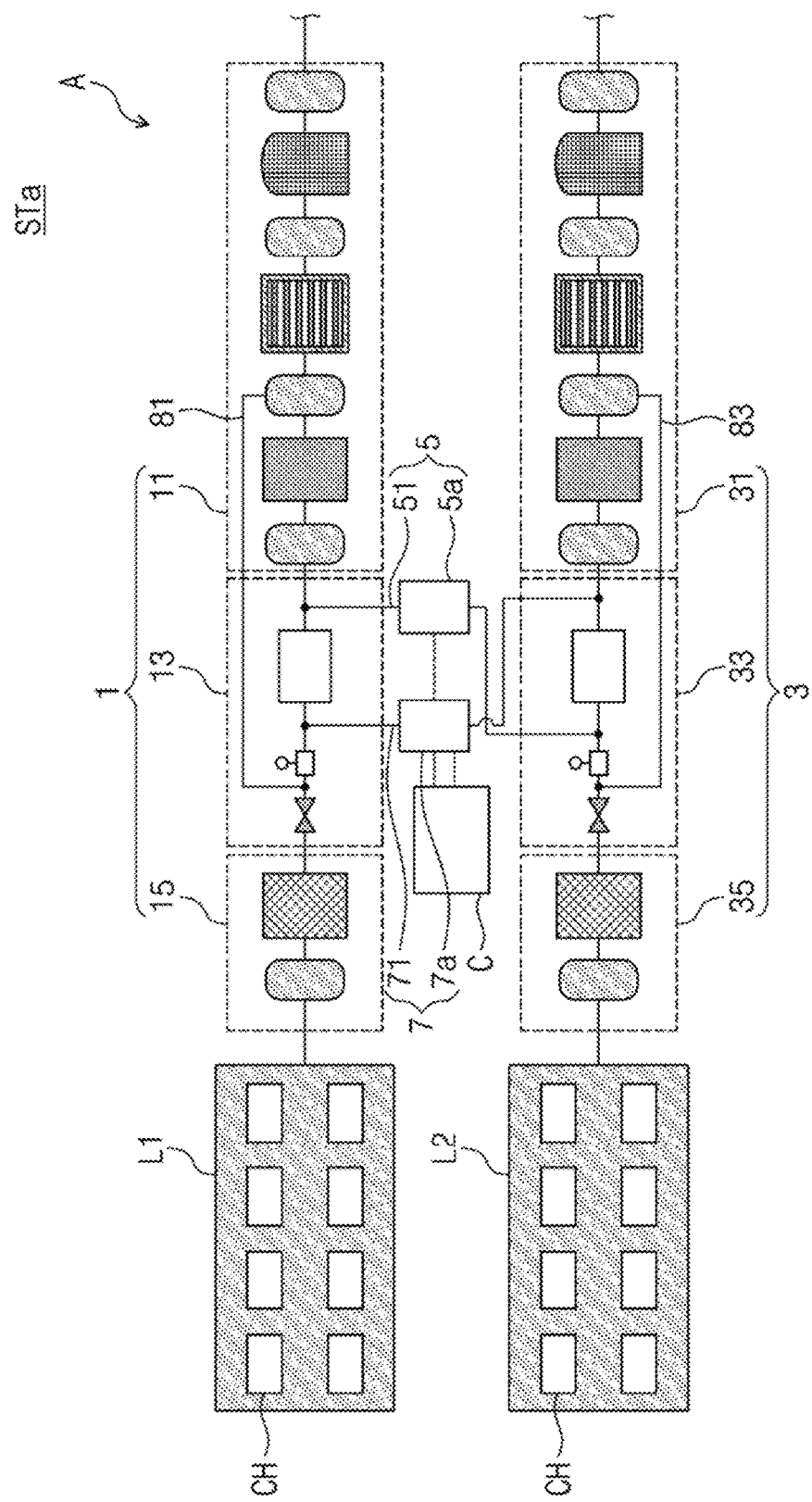
FIG. 14 illustrates a simplified schematic diagram showing a substrate processing system according to some embodiments of the present disclosure.

FIG. 14 illustrates a simplified schematic diagram showing a substrate processing system according to some embodiments of the present disclosure.

The following may omit repetitive description of contents substantially the same as or similar to descriptions provided above with reference to FIGS. 1 to 13.

Referring to FIG. 14, a substrate processing system STa may be provided. Unlike the embodiment illustrated in FIG. 1, the substrate processing system STa may further include a first recovery pipe 81 and a second recovery pipe 83.

The first recovery pipe 81 may connect the first connection part 13 and the first front-side filtering part 11 to each other to allow a portion of fluid in the first connection part 13 to move back to the first front-side filtering part 11. When the first rear-side filtering part 15 does not handle all of fluid supplied at a certain rate from the first front-side filtering part 11, a portion of fluid may return to the first front-side filtering part 11. The second recovery pipe 83 may also have a function similar to that of the first recovery pipe 81.

Figure 15:
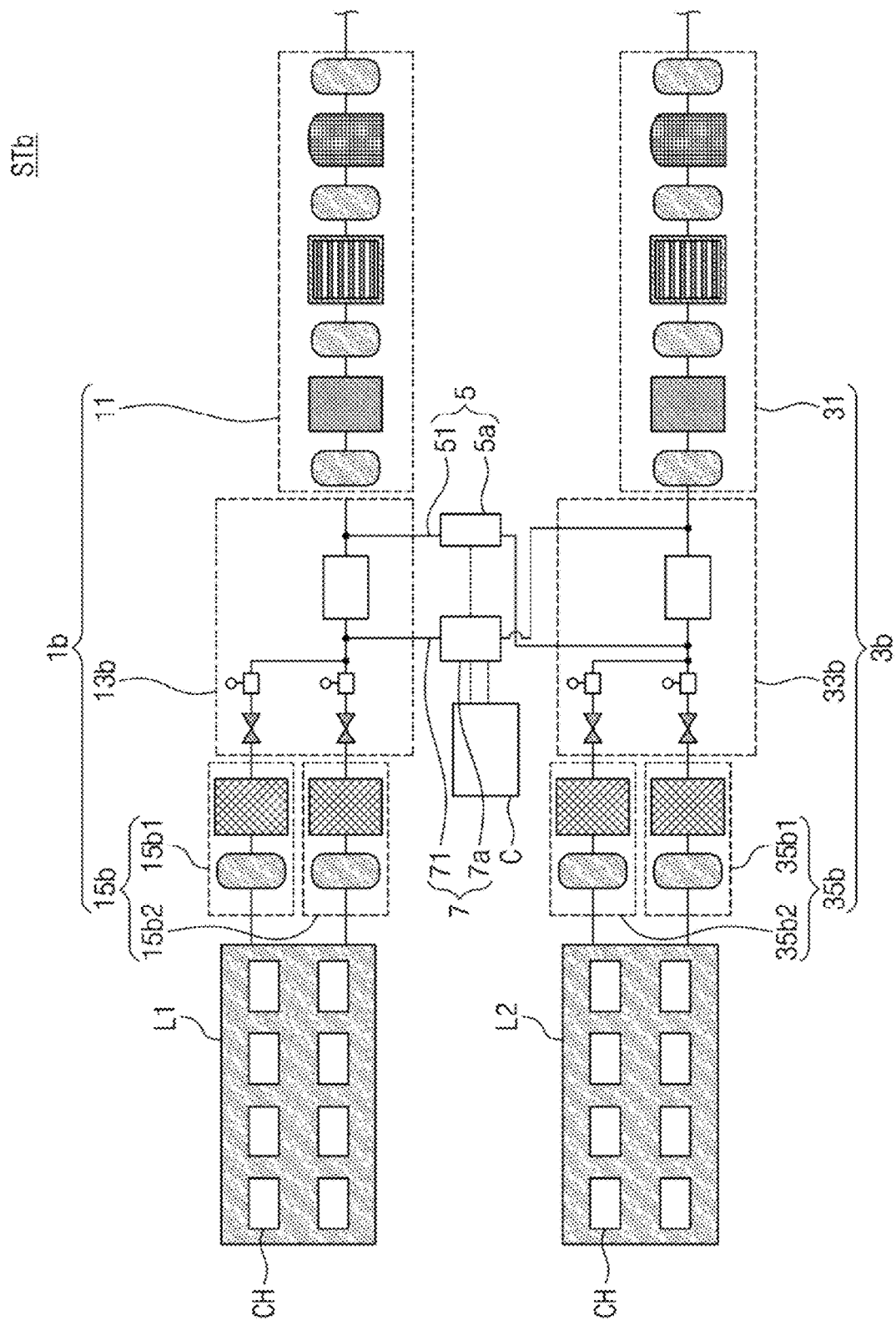
FIG. 15 illustrates a simplified schematic diagram showing a substrate processing system according to some embodiments of the present disclosure.

FIG. 15 illustrates a simplified schematic diagram showing a substrate processing system according to some embodiments of the present disclosure.

The following may omit repetitive description of contents substantially the same as or similar to descriptions provided above with reference to FIGS. 1 to 14.

Referring to FIG. 15, a substrate processing system STb may be provided. Unlike the embodiment shown in FIG. 1, in the substrate processing system STb, a first supply device 1*b* may include a plurality of first rear-side filtering parts 15*b*. For example, two first rear-side filtering parts 15*b*1 and 15*b*2 may be provided. Thus when there is an increase in flow rate of fluid supplied from the first front-side filtering part 11, the two first rear-side filtering parts 15*b*1 and 15*b*2 may treat all of fluid supplied at an increased flow rate. A first supply device 3*b* may also be similar to the first supply device 1*b*.

According to an ultrapure water supply apparatus, a substrate processing system including the same, and a substrate processing method using the same in accordance with embodiments of the present disclosure, it may be possible to stably supply ultrapure water to two or more semiconductor fabrication lines.

According to an ultrapure water supply apparatus, a substrate processing system including the same, and a substrate processing method using the same in accordance with embodiments of the present disclosure, it may be possible to continuously supply ultrapure water having a constant quality.

According to an ultrapure water supply apparatus, a substrate processing system including the same, and a substrate processing method using the same in accordance with embodiments of the present disclosure, it may be possible to prepare for some trouble of equipment.

Effects of embodiments of the present disclosure are not limited to the effects mentioned above, and other effects which have not been mentioned above will be clearly understood to those skilled in the art from the above description.

Although example embodiments of the present disclosure have been described in connection with the accompanying drawings, it will be understood to those skilled in the art that various changes and modifications may be made without departing from the technical spirit of the present disclosure. It therefore will be understood that the example embodiments described above are just illustrative and not limitative in all aspects.

What is claimed is:

1. An ultrapure water supply apparatus comprising:
   a first supply device configured to produce first ultrapure water;
   a second supply device configured to produce second ultrapure water;
   a first reserved supply device that is configured to provide the second supply device with a portion of fluid in the first supply device; and
   a second reserved supply device that is configured to provide the first supply device with a portion of fluid in the second supply device,
   wherein the first supply device comprises:
   a first front-side filtering part;
   a first rear-side filtering part configured to filter fluid that passes through the first front-side filtering part; and a first connection part between the first front-side filtering part and the first rear-side filtering part, wherein the second supply device comprises:
a second front-side filtering part;
a second rear-side filtering part configured to filter fluid that passes through the second front-side filtering part; and
a second connection part between the second front-side filtering part and the second rear-side filtering part, and wherein each of the first reserved supply device and the second reserved supply device connects the first connection part and the second connection part to each other.

2. The ultrapure water supply apparatus of claim 1, wherein the first reserved supply device comprises:
a first reserved pipe that connects the first connection part and the second connection part to each other; and
a first reserved valve on the first reserved pipe.

3. The ultrapure water supply apparatus of claim 2, wherein the first reserved supply device comprises:
a first bypass pipe; and
a first bypass valve on the first bypass pipe,
wherein a first end of the first bypass pipe is connected to the first reserved pipe in front of the first reserved valve, and
wherein a second end of the first bypass pipe is connected to the first reserved pipe behind the first reserved valve.

4. The ultrapure water supply apparatus of claim 3, wherein the first reserved supply device further comprises a first shutoff valve on the first reserved pipe between the first reserved valve and the first bypass pipe.

5. The ultrapure water supply apparatus of claim 2, wherein the first reserved supply device further comprises a first resistivity meter on the first reserved pipe.

6. The ultrapure water supply apparatus of claim 1, wherein the first connection part comprises:
a first connection pipe between the first front-side filtering part and the first rear-side filtering part; and
a first flow meter on the first connection pipe,
wherein the first reserved supply device is connected to the first connection pipe between the first flow meter and the first front-side filtering part.

7. The ultrapure water supply apparatus of claim 1, wherein each of the first front-side filtering part and the first rear-side filtering part comprises at least one from among an activated carbon filter device, an ion exchange resin device, a reverse osmosis membrane device, and a hollow fiber membrane device.

* * * * *